US006392487B1

(12) United States Patent
Alexanian

(10) Patent No.: US 6,392,487 B1
(45) Date of Patent: May 21, 2002

(54) VARIABLE GAIN AMPLIFIER

(75) Inventor: Angelos Alexanian, Somerville, MA (US)

(73) Assignee: RF Micro Devices, INC, Greensboro, NC (US)

( * ) Notice: Subject to any disclaimer, the term of this patent is extended or adjusted under 35 U.S.C. 154(b) by 73 days.

(21) Appl. No.: 09/631,182

(22) Filed: Aug. 2, 2000

(51) Int. Cl.$^7$ ................................................ H03F 3/45
(52) U.S. Cl. ..................................................... 330/254
(58) Field of Search ............................... 330/254, 278, 330/301; 327/359

(56) References Cited

U.S. PATENT DOCUMENTS

| | | | |
|---|---|---|---|
| 5,331,290 A | 7/1994 | Harford et al. ............. | 330/254 |
| 5,467,057 A | 11/1995 | Joardar ........................ | 330/254 |
| 5,912,588 A | 6/1999 | Nummila ..................... | 330/254 |
| 5,914,637 A | * 6/1999 | Kagawa ....................... | 330/254 |
| 5,949,286 A | 9/1999 | Jones .......................... | 330/254 |
| 5,999,056 A | 12/1999 | Fong ........................... | 330/278 |
| 6,031,878 A | 2/2000 | Tomasz et al. ............. | 375/316 |

OTHER PUBLICATIONS

Yung, M. et al., "Highly Integrated InP HBT Optical Receivers," IEEE Jornal of Solid–State Circuits, vol. 34, No. 2, pp. 219–227, Feb. 1999.

* cited by examiner

*Primary Examiner*—Steven J. Mottola
(74) *Attorney, Agent, or Firm*—Withrow & Terranova, P.L.L.C.

(57) ABSTRACT

A variable gain amplifier or amplification stage uses a current steering circuit to split amplifier output current between a gain path and a shunt path to control amplifier gain. One or more primary current steering circuit devices in the gain and shunt paths are inversely controlled to determine in what ratio the amplifier output current splits between the gain and shunt paths. One or more smaller, secondary current steering circuit devices connect in parallel with gain path primary circuit devices and are commonly controlled with the shunt path primary circuit devices. This arrangement insures a well-controlled minimum gain path current at a minimum amplifier gain setting. Minimum gain occurs when the gain path primary circuit devices are fully off and the shunt path primary circuit devices are fully on. In this state, the gain path secondary circuit devices are on and a small amount of amplifier output current flows through the gain path. With well-defined minimum gain path current, the amplifier stage provides stable minimum gain characteristics that can be made relatively insensitive to temperature and device variations. Further, gain control does not interfere with amplifier biasing, thus improving amplifier linearity. Gain control inputs provide the ability to vary amplifier gain between the well-defined minimum and maximum gain settings, with excellent linearity and low intermodulation distortion over the gain control range. Various configurations of the amplifier gain stage address both single-ended and differential amplifier topologies.

39 Claims, 7 Drawing Sheets

VARIABLE GAIN AMPLIFIER

FIELD OF THE INVENTION

The present invention relates to radio frequency amplifiers and particularly relates to a variable gain radio frequency amplifier stage.

BACKGROUND OF THE INVENTION

Wireless communication systems enjoy significant popularity, finding widespread use in both developed and developing regions. Indeed, the very popularity of wireless communication systems spurs their development and advancement, driving system designers and service providers to devise ways of supporting more users within a finite radio frequency spectrum. Existing and pending wireless communications standards typically rely on frequency, code, or time-division multiplexing techniques that allow multiple portable communication device users to share the same frequencies within a given service area. Commonly, such access schemes benefit from each wireless device controlling their transmitted signal power to help minimize its interference with other active devices within a given wireless service area.

This power control approach presents portable device designers with significant challenges. For example, power-control techniques typically require transmit signal amplifier circuits that provide a range (often continuous) of transmit signal gain. This allows a controlling device (e.g., a cellular telephone) to transmit with a desired signal power based on adjusting the gain of one or more such transmit signal amplifier circuits. For example, as the portable device moves closer to a supporting base station, the wireless communications system may instruct, via control signaling, the portable device to reduce its transmit power. Essentially, in such wireless communications systems, active portable devices are controlled such that they transmit with the minimum necessary signal power at all times.

High signal fidelity requirements impose further challenges on designers of wireless communications transmitters. Many wireless communication standards impose strict adjacent channel power limitations—a measure of unwanted signal power appearing in radio channels adjacent to the selected transmit channel. Digital modulation schemes, such as those used in GSM or PCS systems, typically require phase or frequency modulation in combination with amplitude modulation. The need for envelope modulation (amplitude) imposes a requirement for linear amplification of the transmit signal. As noted, this linear amplification function must usually support variable gain, so that the linear, radio frequency signal may be gain adjusted to comply with transmit signal output power control requirements.

Thus, modem wireless communication devices typically must meet the dual, sometimes contradictory requirements of providing flexible transmit signal output power control, while still maintaining good amplification linearity. A number of approaches exist for meeting these design challenges, and include transistor-based amplifier gain stages using differing topologies and differing gain control techniques. Some gain control arrangements adjust the bias signal applied to the transistor amplifiers, but this can have the disadvantage of changing the operating point of the transistors involved, and thus affecting linearity, particularly at the lowest levels of gain. At such low levels of gain, the transistor amplifiers may be at their lower limit of active mode operation, and can thus become significantly nonlinear.

Another approach to transistor amplifier gain control involves providing a transistor amplifier having a gain path and a shunt path, with the shunt path having no signal gain. In operation, a current steering mechanism splits current between the gain and shunt paths to provide a desired amount of signal gain. Because amplifier gain is not controlled through bias changes, this approach has the significant benefit of allowing operation of the transistor amplifier(s) at constant operating point, thereby aiding amplifier linearity. A "Gilbert" cell represents such a configuration for a differential amplifier.

In a Gilbert cell, a differential transistor amplifier pair, each transistor amplifier sinks collector current through both a shunt path having no signal gain, and a gain path that provides signal gain. This is accomplished by placing a collector load (impedance) in the gain path but not in the shunt path. Therefore, the shunt path lacks any impedance across which an output voltage signal can be developed. Current steering circuits control the ratio of gain path and shunt path current to achieve a desired output signal gain.

A significant drawback of the Gilbert cell, and other amplifier topologies that employ current steering techniques to effect gain control is the inability to provide well-controlled minimum gain settings with such techniques. Theoretically, the minimum gain of such circuits is zero, with all of the transistor amplifier current flowing through the zero-gain shunt path. That is, at a given control voltage, the current steering mechanism blocks current from flowing through the gain path, diverting all amplifier current through the shunt path. However, this can result in unstable and widely varying amplifier characteristics as minimum gain is approached.

Accordingly, there remains a need for a radio frequency amplifier gain control technique, such that the gain-controlled amplifier exhibits well-controlled variable gain characteristics. Such characteristics include good amplifier linearity across the gain control range, low intermodulation distortion, and predictable, stable minimum gain characteristics.

SUMMARY OF THE INVENTION

The present invention provides both methods and apparatus for amplifier gain control based on a current steering arrangement that insures a well-defined minimum gain setting and good amplifier linearity over the gain control range. A transistor amplifier is configured with parallel output current paths, a gain path and a shunt path. The gain path includes an impedance element that develops an output signal voltage in response to the amplifier's time-varying output current, while the shunt path is configured to be low-impedance. A current steering circuit determines how the amplifier output current splits between the gain and shunt paths, thereby controlling amplifier gain. At least one gain path primary transistor and shunt path primary transistor are disposed in the gain and shunt paths, respectively. Preferably, these transistors operate with inverse bias control, such that as one transistor turns on, the other turns off. A secondary transistor shares a common bias control with the shunt path primary transistor, but is disposed in the gain path with the gain path primary transistor. When the gain path primary transistor is biased fully off and the shunt path primary transistor is biased fully on at minimum amplifier gain, this secondary transistor is also biased on. This insures a well-controlled minimum amount of gain path current at the minimum amplifier gain setting.

The current steering arrangement may be adapted to both single-ended and differential amplifier topologies and is compatible with a wide range of specific transistor amplifier circuit implementations and bias arrangements. In preferred embodiments, the current steering arrangement is connected in cascade fashion in the collector or drain current path of the transistor amplifier or amplifiers. Gain control is accomplished through steering varying amounts of the amplifier output current through a gain path and a shunt path, rather than by varying amplifier operating voltage or amplifier bias. Thus, a variable gain amplifier operating in accordance with the present invention may employ a fixed bias at an optimum operating point, thereby exhibiting excellent linearity and low intermodulation distortion across the gain control range.

With excellent linearity and low intermodulation distortion characteristics, an amplifier in accordance with the present invention is particularly well suited for use in radio frequency communications apparatus. Such amplifiers may be implemented in a variety of process technologies, adapted for use at both intermediate and high frequencies. Other aspects and features of the present invention will become apparent to those ordinarily skilled in the art upon review of the following description of exemplary embodiments of the invention in conjunction with the accompanying figures.

DETAILED DESCRIPTION OF THE INVENTION

Figure 1:
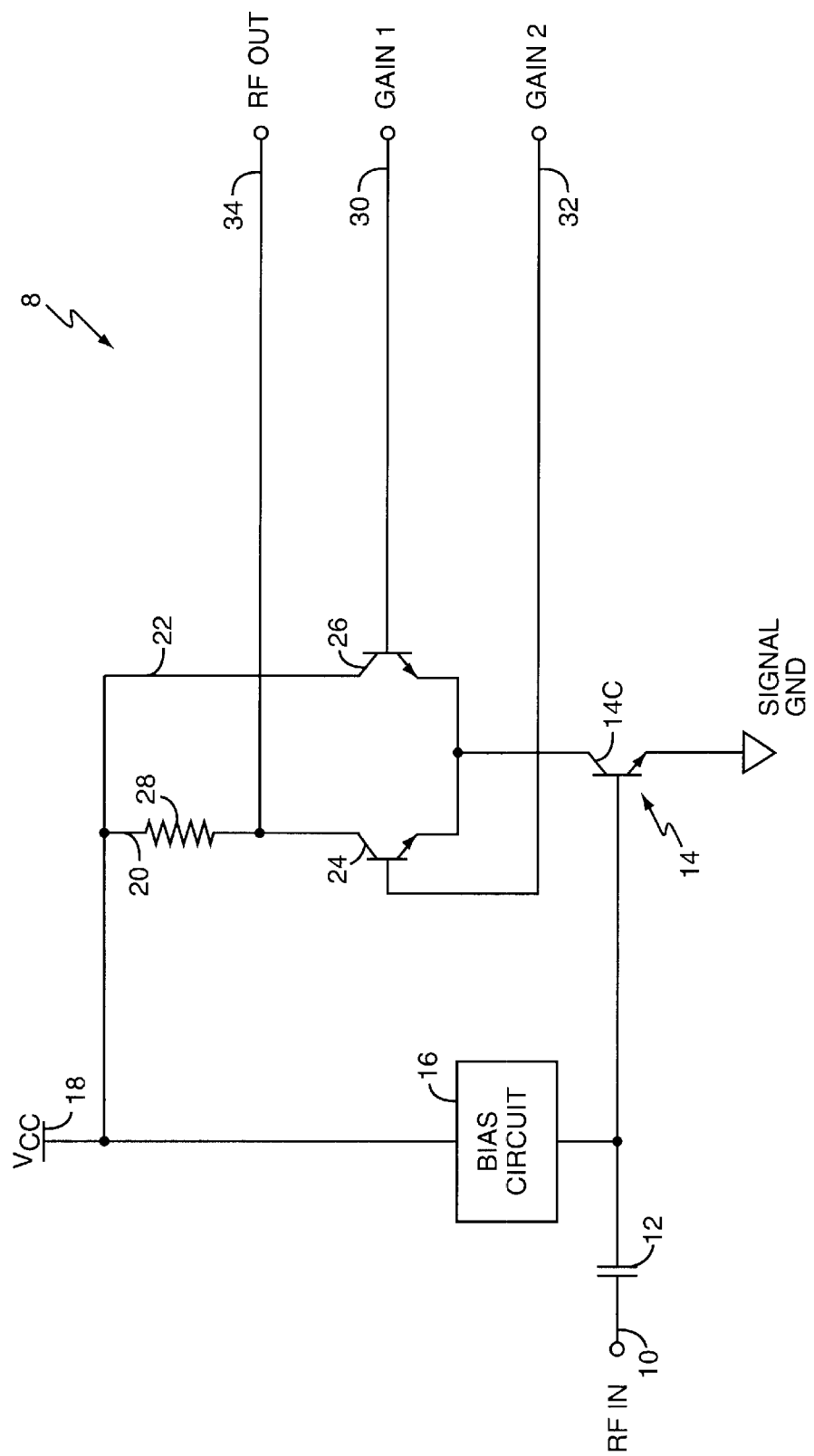
FIG. 1 illustrates a typical current steering arrangement for controlling amplifier gain.

FIG. 1 illustrates a typical approach to effecting amplifier gain control through current steering techniques. An amplifier circuit 8 includes a radio frequency signal input 10, an input coupling capacitor 12, a transistor amplifier 14, a bias circuit 16, an operating voltage 18, gain and shunt paths 20 and 22, respectively, and gain control transistors 24 and 26. The amplifier circuit 8 further includes a gain resistor 28, gain control inputs 30 and 32, and an RF signal output 34.

In operation, RF signals applied to the RF input 10 are coupled through the input capacitor 12, where they serve to drive the transistor amplifier 14. With proper biasing current from the bias circuit 16, the transistor amplifier 14 is responsive to the RF input signal, and provides an output current on its collector 14C that represents an amplified version of the input signal. Typically, a voltage supply 18 provides power to the bias circuit and overall amplifier circuit 8. Gain path 20 and shunt path 22 provide current steering transistors 24 and 26 with the ability to control the signal gain of the transistor amplifier 14.

An external system (not shown) applies control signals to the control inputs 30 and 32 to steer more or less of the collector current of the transistor amplifier 14 through the gain path 20, which includes the gain resistor 28. In contrast, the shunt path typically includes no gain element, and represents zero gain (infinite loss). For the amplifier circuit 8, minimum gain occurs when all collector current into the transistor amplifier 26 flows through the shunt path 22, while maximum gain occurs when all of that current flows through the gain path 20.

Minimum gain operation is subject to problematic operation with this existing approach. Theoretically, the minimum gain of the amplifier circuit 8 is zero. In practical implementations however, the minimum gain of the amplifier circuit 8 can be non-zero and ill-defined due to semiconductor device leakages, semiconductor process variations, and other non-ideal aspects of circuit fabrication and layout. Further, these effects can vary with both frequency and temperature. Indeed, reliably achieving and maintaining a desired minimum gain with the amplifier circuit 8 is difficult. For example, the amplifier circuit 8 may be replicated in a great many integrated circuit devices, for use in, for example, a production run of cellular telephones. During design, a nominal gain control voltage range would have been identified for minimum and maximum gain settings, as well as for intermediate gain settings between the maximum and minimum. However, due to process and fabrication variations attendant with any semiconductor fabrication process, the actual control voltages applied to control inputs 30 and 32 required for a desired minimum gain can vary substantially from device to device. Moreover, the temperature sensitivity of the amplifier circuit 8 is such that maintaining a desired minimum gain setting can be difficult.

Figure 2:
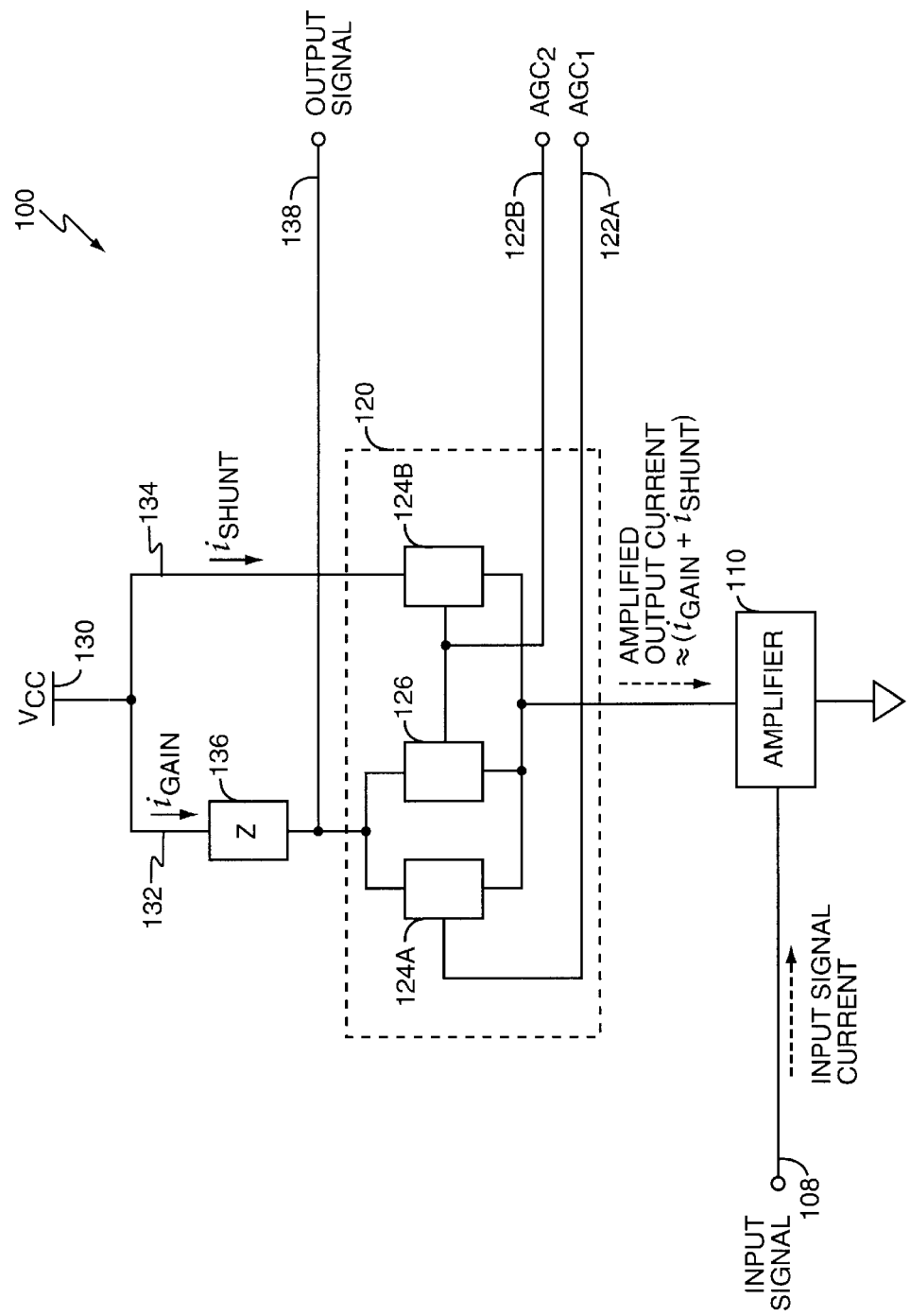
FIG. 2 illustrates an amplifier arrangement including an exemplary embodiment of the current steering circuit of the present invention for use with single-ended amplifier configurations.

FIG. 2 depicts an exemplary implementation of the present invention. As shown, the amplifier circuit 100 includes an amplifier 110, an RF signal input 108, a current steering circuit 120 with control inputs 122B and 122A, an operating voltage input 130, gain and shunt amplifier output current paths 132 and 134, respectively, and an amplified RF signal output 138. Further, the gain path 132 includes a gain element 136, while the current steering circuit includes a gain path primary circuit device 124A, a shunt path primary circuit device 124B, and a gain path secondary circuit device 126.

With the present invention, the minimum and maximum amplifier gain may be set during the design phase based on selecting desired values for a number of well-controlled parameters, thus allowing fabrication of amplifier circuits with substantially consistent gain control performance. With the amplifier circuit 8 shown in FIG. 11 the theoretical minimum gain of zero was not achieved due to stray capacitances, non-ideal circuit layout, current leakages, and other non-ideal device effects. While the amplifier circuit 100 may not be immune to such real-world nuisances, the present invention does offer the ability to set a minimum gain path current large enough in magnitude to minimize the significance of any such effects.

Further, the present invention makes the real-world minimum gain of the amplifier circuit 100 dependent upon a few, well-controlled design parameters, rather than the uncertain and variable non-ideal effects that plague minimum gain operation of the amplifier circuit 8. With the amplifier circuit 100, the circuit devices 124B and 126 may be designed such that the magnitude of current conducted through the secondary circuit device 126 is a desired ratio less than that conducted through the primary device 124B for a value of control signal applied to the control input 122B.

The gain element 136 is preferably an impedance element, such as an inductor or resistor, across which an output signal voltage that is proportional to the amount of amplifier current flowing through the gain path 132. Because the shunt path 134 is preferably configured to have minimal or zero impedance, amplifier output current flowing in the shunt path 134 does not produce an output signal. The current steering circuit 120 allows an external system (not shown) to steer amplifier output current through the gain and shunt paths 132 and 134, respectively, thereby controlling the output signal gain of the amplifier 110. The external system implements such control by applying appropriate signals to the control inputs 122B and 122A. The current steering circuit devices 124A, 124B, and 126 may operate, for example, as voltage-controlled impedances or as current-controlled impedances. Thus, in a general sense, the current steering circuit 120 allows the external system to control the conductance of the gain path 132 and shunt path 134 to effect amplifier gain control.

In operation, the gain path primary circuit device 124A and the shunt path primary circuit device 124B allow varying levels of current flow in accordance with the applied control signals. For example, at a given control voltage on control input 122A, the gain path primary circuit device 124A might be fully on, fully off, or at an intermediate state. These states correspond to minimum impedance, maximum impedance, and intermediate impedances. The shunt path primary circuit device 124B is similarly responsive to control voltages applied to the control input 122B. Preferably, the control voltages applied to 122A and 122B are complementary. That is, as the gain path primary circuit device 124A is driven to lower impedance, the shunt path primary circuit device 124B is driven to a higher impedance, and vice-versa.

The gain path secondary device 126 operates similarly to the primary circuit devices 124A and 124B. However, while the secondary circuit device 126 is placed in the gain path 132, its control input is commonly connected with that of the shunt path primary circuit device 124B. In this manner, the conducting state (on, off, partially on) of the secondary circuit device 126 follows that of the shunt path primary circuit device 124B. With this configuration, a minimum gain setting where the primary circuit device 124A is fully off and the primary circuit device 124B is fully on, results in a predictable, defined value of amplifier gain. This results from the secondary circuit device 126 being turned on in conjunction with the primary circuit device 124B. At minimum amplifier gain a small amount of current flows through the gain path 132 by virtue of the secondary circuit device 126.

Preferably, the secondary circuit device 126 is designed such that it passes less current than the shunt path primary circuit device 124B for a given control voltage applied to the control input 122A. This is desirable because, in most designs, the amount of amplifier current that must flow through the gain path 132 at minimum gain is quite small in comparison to the magnitude of intermediate and maximum gain amplifier currents that must be handled by the primary circuit device 124A. Similarly, it is preferable that the primary circuit devices 124A and 124B have similar control signal-to-conduction state characteristics (e.g., control voltage response) in the interest of simplifying the control signals that must be applied to the control inputs 122A and 122B to achieve a desired gain for the amplifier circuit 100.

Thus, the control signal or signals provided to the current steering circuit 120 via the control inputs 122A and 122B determine the ratio between the current flowing through the gain path 132 and that flowing through the shunt path 134. Clearly, as the ratio of gain path current ($i_{GAIN}$) to shunt path current ($i_{SHUNT}$) increases, the signal gain of the output RF signal (RF OUT) increases with respect to the RF input signal (RF IN). Conversely, as the ratio of $i_{GAIN}$ to $i_{SHUNT}$ decreases, the signal gain (RF OUT to RF IN) of the amplifier circuit 100 decreases. However, unlike existing gain control schemes that use some type of current steering, the present invention ensures that a minimum amount of $i_{GAIN}$ current flows when the amplifier circuit 100 is active and at or above the lowest amplifier gain settings.

Figure 3:
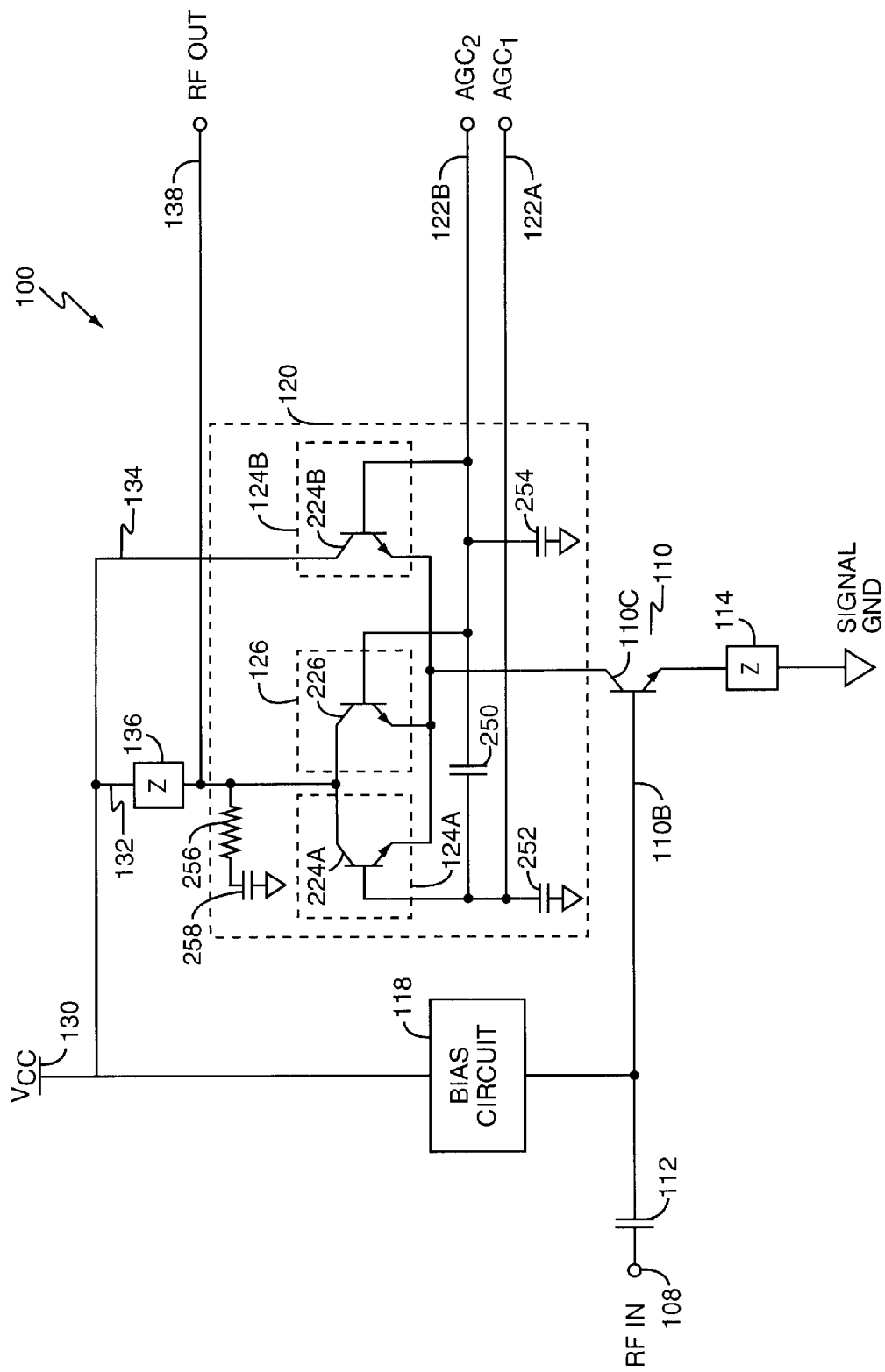
FIG. 3 illustrates an exemplary embodiment for the circuit of FIG. 2.

FIG. 3 depicts an exemplary, single-ended amplifier configuration in one embodiment of the present invention. In this embodiment, the current steering circuits 124A, 124B, and 126 are implemented as transistors 224A, 224B, and 226, respectively. The current steering circuit 120 further includes shunt and coupling capacitors 250, 252, and 254, as well as a high-frequency roll-off filter comprising a resistor 256 and capacitor 258. An RF signal is applied to the signal input 108 and drives a transistor amplifier 110 through an input coupling capacitor 112. An emitter degeneration impedance 114 (e.g., a resistor) provides operating voltage feedback to the transistor amplifier 110, as is well understood by those skilled in the art. The bias circuit 118 is configured to provide a bias current sufficient to maintain the transistor amplifier 110 in a linear mode of amplification over the range of expected RF input signal amplitudes. Substantial variation exists with regard to implementing the amplifier 110, the bias circuit 118, and other supporting circuits, as will be readily appreciated by those skilled in the art.

As introduced in the discussion of FIG. 3, the values of a few, well-controlled parameters establish the minimum and maximum gains for a given implementation of the amplifier circuit 100. In the embodiment shown in FIG. 3, the minimum and maximum gains and, hence, gain range, are set by selecting values for the gain path impedance 136 and the degeneration impedance 114, and by selecting appropriates sizes for the transistors 224B and 126. For example, the size of the secondary transistor 126 may be selected in relation to the size of the primary transistor 224B such that when both transistors are biased on at minimum amplifier gain, the current through the secondary transistor 226 is a desired ratio less than that through the primary transistor 224B.

This primary-to-secondary transistor size ratio establishes the gain range for the amplifier circuit 100. Absolute values of minimum and maximum gain for the amplifier circuit 100 are determined by the size ratio and the values of impedances 136 and 114. To better understand this relationship, first assume that a given size ratio between the shunt path primary transistor 224B and the gain path secondary resistor 226 is established and given values for the gain path impedance 136 and degeneration impedance 114 are chosen to provide an amplifier gain range of 0 dB to 20 dB. If the given size ratio is maintained, the designed-for gain range may be shifted to, say, 10 dB to 30 dB, simply be adjusting the gain path impedance 136, the degeneration impedance 114, or a combination thereof.

Control signals applied to control inputs 122A and 122B allow the external system (not shown) to effect automatic gain control (AGC) for the amplifier circuit 100. Note that the signal applied to the control input 122A ($AGC_1$) controls the gain path primary transistor 224A, while the signal applied to the control input 122B ($AGC_2$) controls both the gain path secondary transistor 226 and the shunt path primary transistor 224B. As with the generalized embodiment of FIG. 2, the control inputs 122A and 122B preferably are controlled with an inverse control relationship, meaning that as the bias signal $AGC_1$ increases, the bias signal $AGC_2$ decreases and vice versa. Thus, the external system controls the gain of an output signal (RF OUT) provided on the signal output 138 by controlling the relative degree to which the gain and shunt path transistors 224A, 226, and 224B, respectively, are turned on.

While the absolute signal levels (e.g., voltage) of $AGC_1$ and $AGC_2$ required for proper operation of the current steering circuit 120 are dependent upon the operating voltages of the overall amplifier circuit 100, the relative values of $AGC_1$ and $AGC_2$ determine amplifier gain. For example, as the signal level of $AGC_1$ increases beyond a given level, the primary transistor 224A begins turning on and conducting current through the gain path 132. Increasing the level of $AGC_1$ further turns the primary transistor 224A fully on, where it represents a minimum impedance and voltage drop in the gain path 132. Similarly, as the signal level of $AGC_2$ increases beyond a given level, the primary transistor 224B and the secondary transistor 226 begin turning on, with the primary transistor 224B conducting current through the shunt path 134 and the secondary transistor 226 conducting current through the gain path 132. Increasing the level of $AGC_2$ further turns the primary transistor 224B and the secondary transistor 226, eventually turning these transistors fully on, where they have a maximum conductance and minimum voltage drop. Preferably, the $AGC_1$ and $AGC_2$ control signals applied to the control inputs 122A and 122B are inversely controlled such that as current through the gain path 132 increases, the current through the shunt path 134 decreases, and vice versa.

With control of the secondary transistor 226 in the gain path tied to control of the primary transistor 224B in the shunt path, a minimal amount of gain path current may be conducted through the gain path 132 even when the gain path primary transistor 224A is non-conducting. For example, as the $AGC_2$ signal applied to the control input 122B increases and the $AGC_1$ signal applied to the control input 122A decreases, current in the gain path 132 decreases while current in the shunt path 134 increases. However, the secondary transistor 226 in the gain path 132 also begins turning on as $AGC_2$ increases. This action sets a minimum gain path current for a defined control voltage applied to 122A and 122B corresponding to a desired minimum gain for the amplifier circuit 100.

The amount of current that flows through the secondary transistor 226 in comparison to that which flows through the primary transistor 224B when both are fully turned on determines the amount of current flowing through the gain impedance 136 (shown as a resistive element) at the minimum gain setting of the amplifier circuit 100. Thus, an integrated circuit device incorporating the amplifier circuit 100, or at least the current steering mechanism 120, may be fabricated with a desired size ratio between the current steering transistors 224A, 224B, and 226. Individual design requirements will dictate specific size ratios, but the present invention contemplates a ratio of 32:1 for the size of the primary transistor 224B compared to the secondary transistor 226 in at least one embodiment. With this size differential, the secondary transistor 226 conducts a finite but small amount of current through the gain impedance 136, compared to the relatively large shunt current conducted through the shunt path 134 by the primary transistor 224B, when both transistors 224B and 226 are biased on.

Thus, maximum output signal gain for the amplifier circuit 100 occurs when the external system controls the current steering circuit 120 such that all amplifier output current is routed through the gain path, thereby developing an output signal voltage across the gain element 136, which is available on the signal output 138. With the configuration shown in FIG. 3, this maximum gain occurs for a given maximum signal level applied to the control input 122A and a minimum signal level applied to the control input 122B. As noted, the absolute levels for the $AGC_1$ and $AGC_2$ control signals may depend upon the operating conditions of the overall amplifier circuit 100. Similarly, minimum output signal gain for the amplifier circuit occurs when the external system controls the current steering circuit 120 such that most of the amplifier output current is routed through the shunt path 134. In this state, a desired minimum amount of amplifier output current flows through the gain path 132 through the secondary transistor 224.

Note that the shunt and coupling capacitors 250, 252, and 254 are generally needed only when using the amplifier circuit 100 to amplify higher frequency signals, such as 800 MHz and above. When operating the amplifier circuit 100 with such frequencies, parasitic capacitances and unwanted signal coupling can generate AC signals on the bases of transistors 224A, 226, and 224B. In this context, the capacitor 252 serves as a low impedance shunt for the base of transistor 224A, while the capacitor 254 serves the same purpose for transistors 224B and 226. Further, the capacitor 250 provides a low impedance AC connection, ideally and AC short, between the bases of 224A and the bases of 224B and 226. This coupling helps insure that no differential AC control signal develops between the current steering transistor bases.

In similar consideration of operating at higher frequencies, some applications of the amplifier circuit 100 may benefit by including the resistor 256 and the capacitor 258 configured as a roll-off filter on the output 138 of the gain path 132. This roll-off limits gain at very high frequencies and can improve the stability of the amplifier circuit 100. For embodiments of the amplifier circuit 100 where more than one gain path RF output is provided, similar roll-off filters are provided for each gain path output. However, as those skilled in the art will readily appreciate, the need for and the particular configuration of AC compensation of the amplifier circuit 100 will vary with design requirements.

Figure 4:
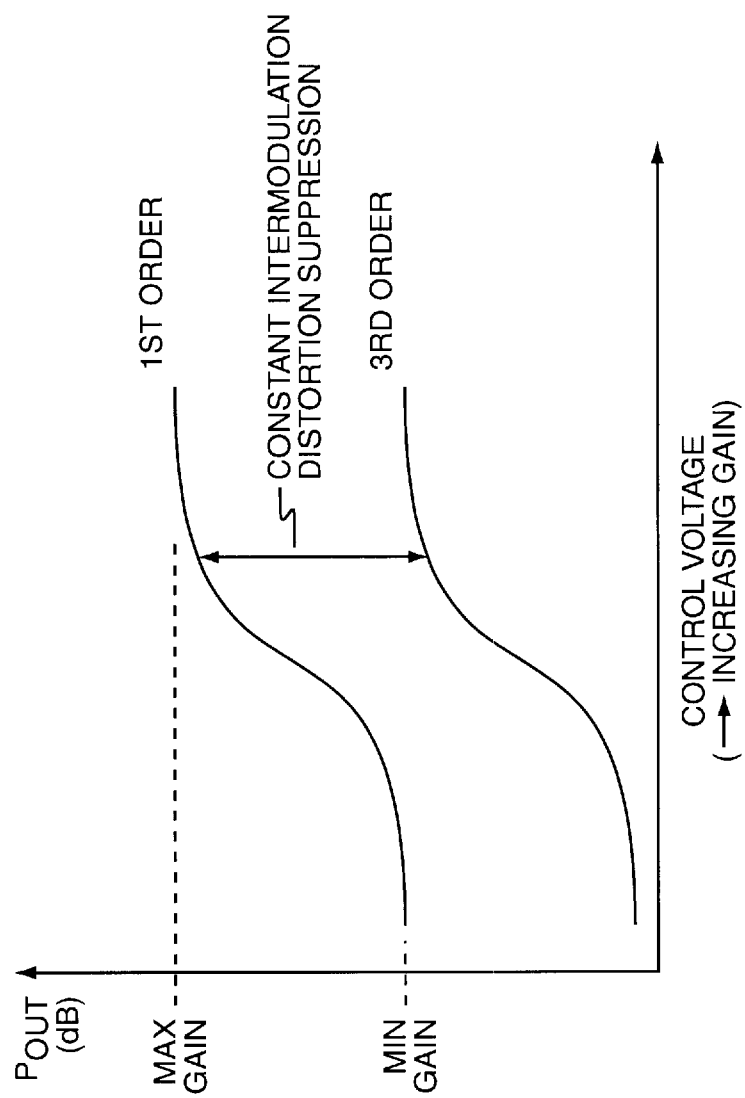
FIG. 4 illustrates general power and intermodulation distortion curves for the present invention.

FIG. 4 provides a generalized depiction of the output power control (RF OUT) for the amplifier circuit 100. Note that the upper curve expresses output signal power as a function of control voltage (i.e., $AGC_1$ and $AGC_2$). As the gain path primary transistor 224A is increasingly turned on and the shunt path primary transistor 224B is increasingly turned off, the output signal gain of the amplifier 110 increases. The action of the gain path secondary transistor 226 establishes the minimum amplifier gain (MIN GAIN) at the minimum control voltage (e.g., levels of $AGC_1$, and $AGC_2$ corresponding to minimum amplifier gain). As noted, a size ratio is established between the primary path secondary transistor 226 and the shunt path primary transistor 224B. Preferably, the gain path secondary transistor 226 conducts less current or has a lower current gain than the shunt path primary transistor 224B for a given level of $AGC_2$. This effect may be achieved, for example, by making the secondary transistor 226 smaller than the primary transistor 224B.

Figure 5:
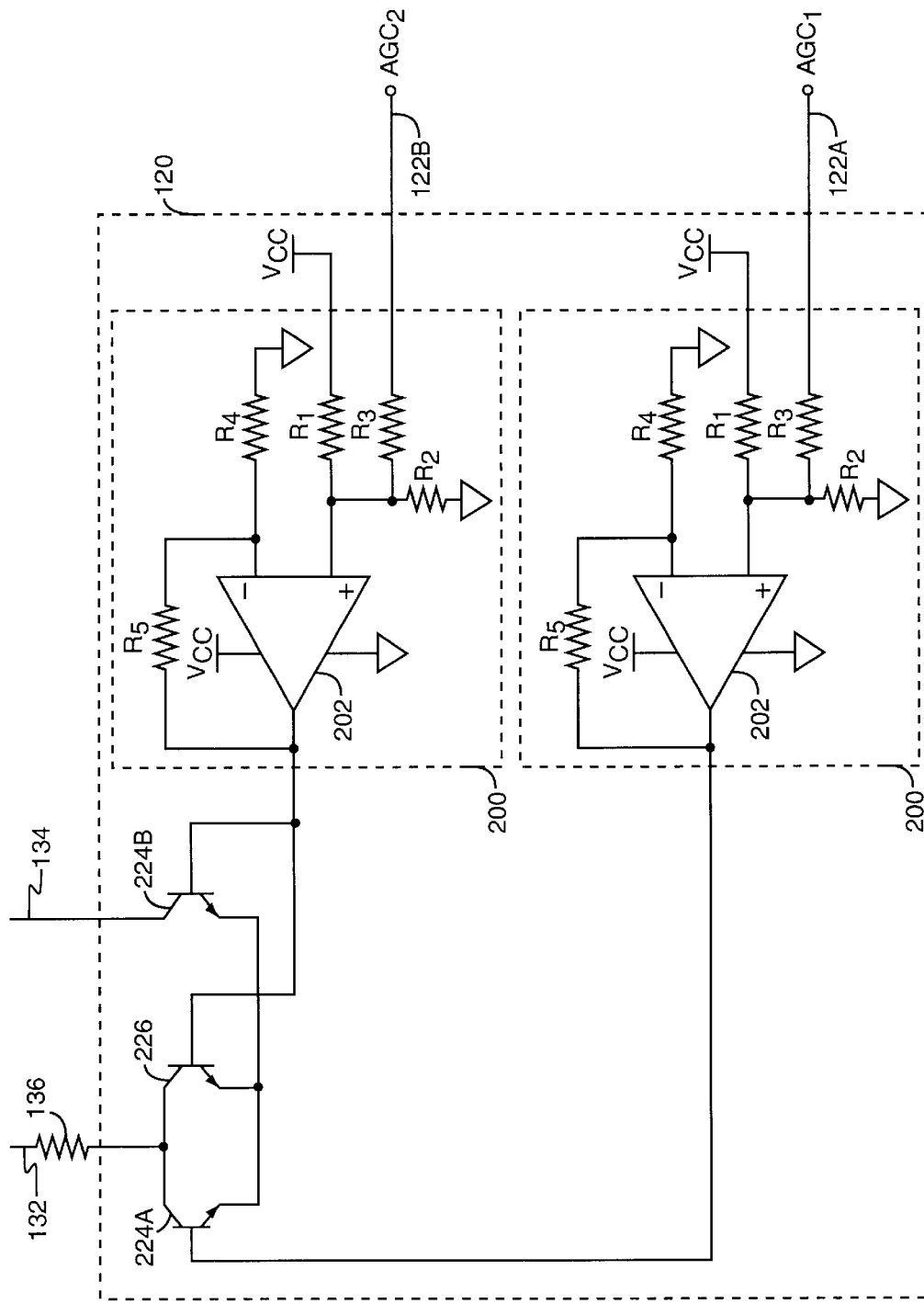
FIG. 5 illustrates exemplary gain control input buffering circuits that may be used in some embodiments of the current steering circuit of the present invention.

FIG. 5 illustrates an alternate embodiment for the current steering circuit 120 of FIG. 3 that may provide more system interface convenience in certain applications. Rather than providing gain control outputs 122A and 122B that directly connect with the current steering transistors 224A, 224B, and 226, the circuit of FIG. 5 includes a buffering and level shifting arrangement 200 on each gain control input. With this additional circuitry, a controlling system (such as a cellular phone control circuit)—not shown—is presented with a high-impedance pair of voltage control inputs, which alleviates the need to provide automatic gain control signals capable of driving transistors 224A, 224B, and 226. Further, the input circuits 200 may be arranged such that the external control voltages fall within a more convenient range. For example, for a given range of input RF signal and operating voltage—as applied to the voltage input 130 of FIG. 3—the amplifier circuit 100 may require $AGC_1$ and $AGC_2$ to vary over the range of 2.0V–2.4V with respect to signal ground.

This control voltage range may not be convenient for the external system. Therefore, the input circuits 200 may be configured to establish a nominal bias voltage point for the current steering transistors 224A, 224B, and 226. With the configuration shown, external control circuitry may vary the $AGC_1$ and $AGC_2$ signals between more convenient ranges, for example, between 0 and 4.096 V. Of course, there are a variety of other buffer and level shifting circuit arrangements that may provide specific advantages in certain applications.

Further variations are contemplated for buffering and interface circuitry applied to the control inputs 122A and 122B. For example, such circuit could allow a single control input, instead of 122A and 122B, to drive the current steering circuit 120 and then internally generate the differential control signals applied to the gain and shunt path current steering circuit devices (124A, 124B, and 126). Of course, if other types of controlled conduction devices are used in the current steering circuit 120 to control the gain path 132 and shunt path 134 currents, the control interface circuitry 200 may be further modified. Note that interface circuit 200 could be modified such that its level shifting function is automatically tied to the value of the supply voltage applied to the supply voltage input 130, or a parameter of the input RF signal to be amplified, such as average value of expected maximum signal amplitude.

Figure 6:
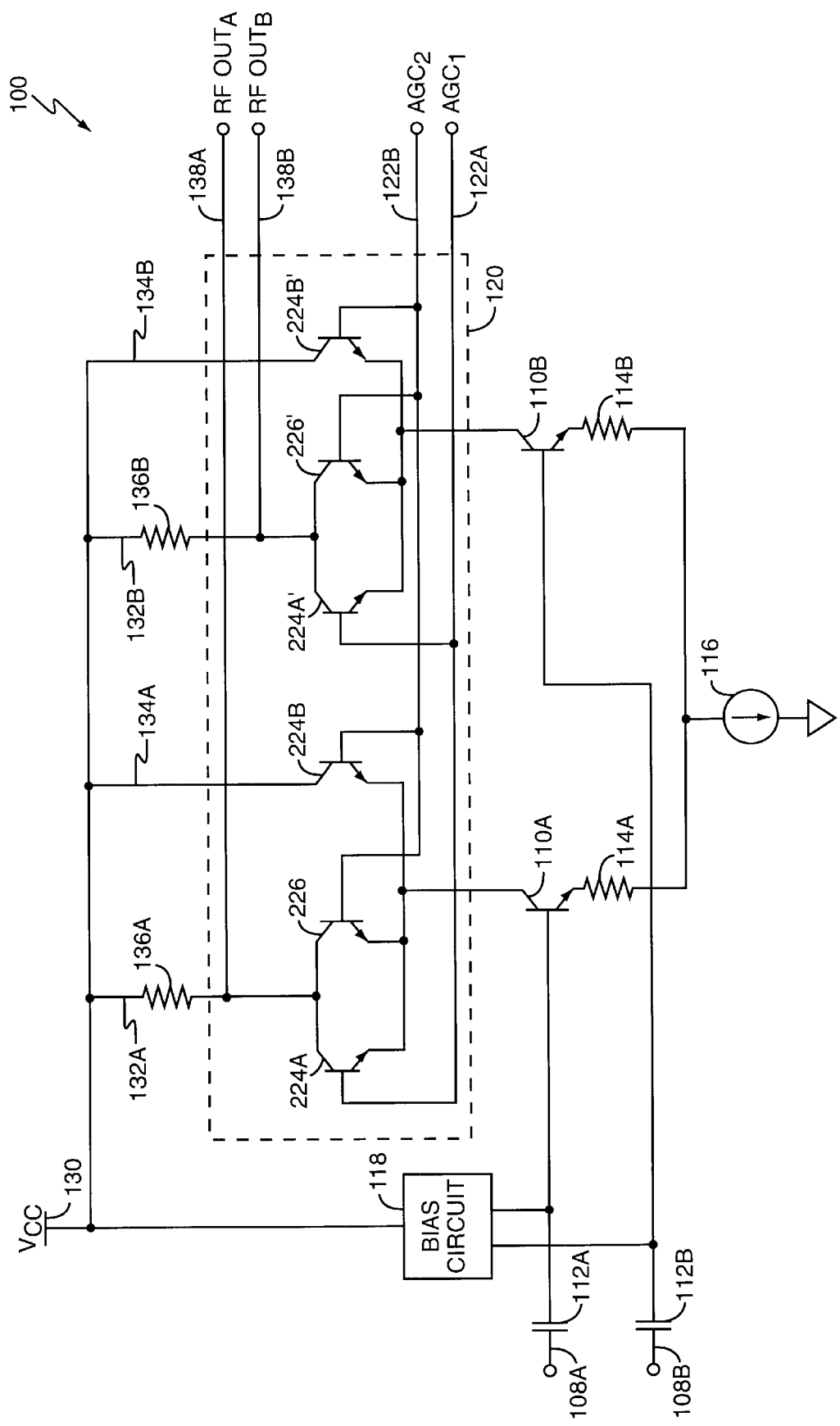
FIG. 6 illustrates an amplifier arrangement including an exemplary embodiment of the current steering circuit of the present invention for use with differential amplifier configurations.

FIG. 6 illustrates an exemplary differential configuration for the amplifier circuit 100. This differential amplification circuit 100 incorporates a variation of the current steering circuit 120. A differential RF drive signal is applied to the inputs 108A and 108B, and coupled through the input coupling capacitors 114A and 114B. Two transistor amplifiers 110A and 110B, with emitter degeneration impedances 114A and 114B, work in tandem with a common current source 116 to provide differential amplification of the differential RF input signal. Outputs 138A and 138B provide a differential RF output signal, which is an amplified version of the input RF signal applied to inputs 108A and 108B. In keeping with its differential configuration, the amplifier circuit 100 includes a gain path 132A with a gain impedance 136A and a shunt path 134A for the transistor amplifier 110A. Similarly, the amplifier circuit includes a gain path 132B with a gain impedance 136B and a shunt path 134B for the transistor amplifier 110B. The gain paths 132A and 132B provide the differential outputs 138A and 138B, respectively.

The current steering transistors 224A, 224B, and 226, control the gain of the transistor amplifier 110A, while the current steering transistors 224A', 224B', and 226', control the gain of the transistor amplifier 110B. Preferably, gain control signals are commonly applied such that the ratio of gain path-to-shunt path current for the transistor amplifiers 110A and 110B remains matched across the range of amplifier gain control. The current steering arrangement includes the gain control inputs 122A and 122B, and is responsive to the relative voltage applied to these inputs, as described in conjunction with FIGS. 2 and 3. When transistors 224A and 224A' are turned fully off and transistors 224B, 224B', 226 and 226' are turned fully on the differential amplifier circuit 100 is at a minimum gain. Conversely, when transistors 224B, 224B', 226, and 226' are turned fully off and transistors 224A and 224A' are biased fully on the differential amplifier circuit 100 is at a maximum gain. As with other embodiments, intermediate gains may be established by adjusting the relative $AGC_1$ and $AGC_2$ voltages between those levels associated with minimum and maximum gains.

Figure 7:
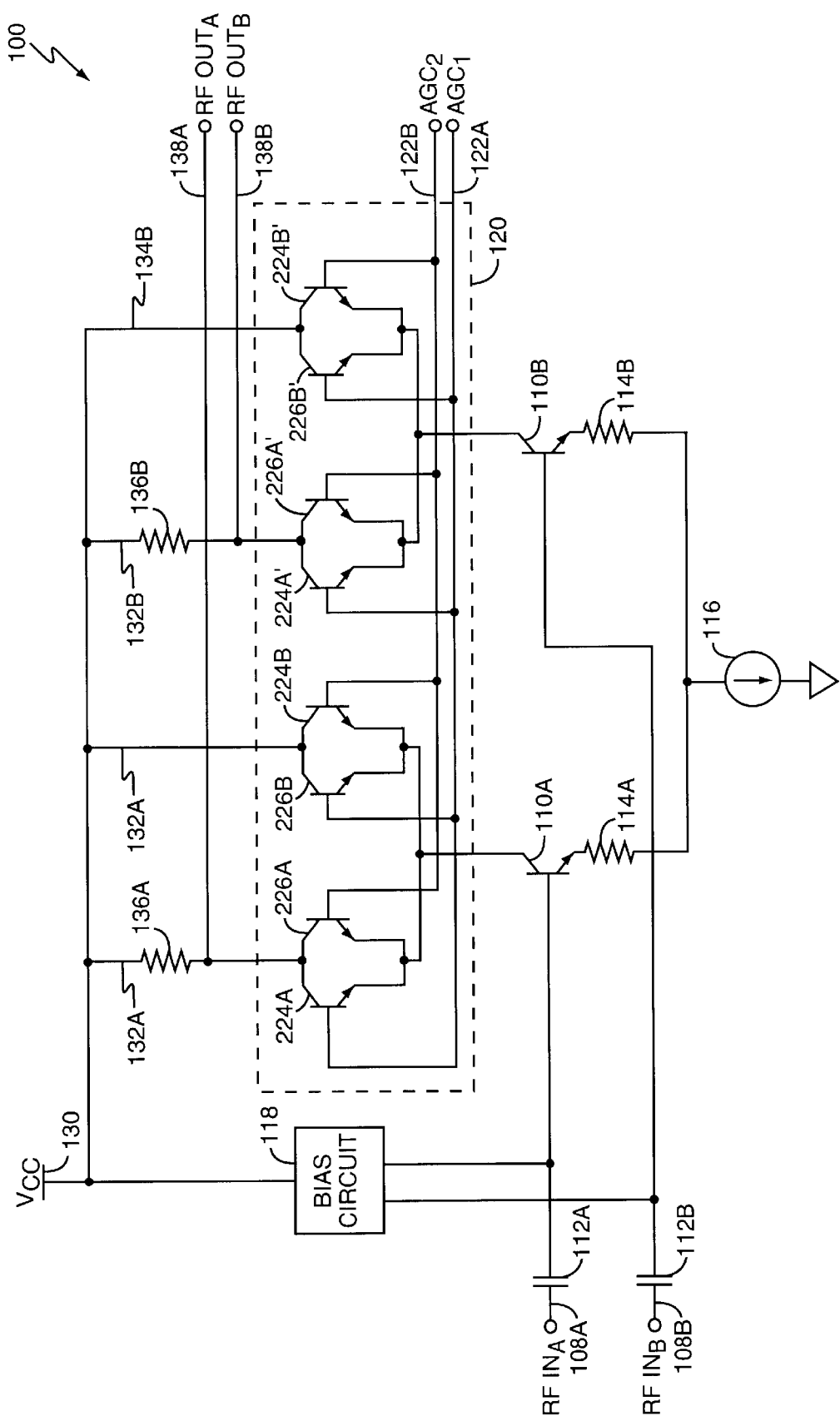
FIG. 7 illustrates an alternate implementation of the differential current steering circuit depicted in FIG. 6.

A variation on the differential amplifier circuit 100 appears in FIG. 7. The amplifier circuit 100 of FIG. 7 differs from that shown in FIG. 6 in that the current steering circuit 120 includes a fully "balanced," i.e., completely symmetrical, current steering arrangement. This balanced arrangement differs from that of FIG. 6 with the addition of secondary transistors 226B and 226B' to the shunt paths 134A and 134B, respectively. Such a fully balanced implementation of the current steering circuit 120 can provide stability advantages in certain applications of the amplifier circuit 100. Again, the differential amplifier circuit 100 may be thought of as two halves, with the current steering transistors 224A, 224B, 226A, and 226B, providing gain control for the transistor amplifier 110A, and 224A', 224B', 226A', and 226B' providing gain control for the transistor amplifier 110B.

In operation, the amplifier circuit 100 of FIG. 7 maintains a defined minimum current through the gain paths 132A and 132B at a minimum defined gain control voltage applied to inputs 122B and 122A by virtue of the gain path secondary transistors 226A and 226A', respectively. Further, the amplifier circuit 100 maintains a defined minimum current through the shunt paths 134A and 134B at a maximum defined gain control voltage applied to inputs 122A and 122B by virtue of the shunt path secondary transistors 226B and 226B' respectively. While this minimally detracts from the maximum gain achievable if all output current for the amplifier transistors 110A and 110B were routed through the gain paths 132A and 132B at maximum gain, it provides "fully balanced" current steering control.

As in earlier embodiments, it may be desirable to establish a first size common to all primary transistors (e.g., 224A, 224B, 224A, 224A', and 224B'), and a second size common to all secondary transistors (e.g., 226A, 226B, 226A', and 226B'). In this manner, a desired primary-to-secondary transistor size ratio is established, and all primary transistors have similar operating behaviors, and all secondary transistors have similar operating behaviors. This similarity of response can simplify the requirements for the gain control signals applied to the control inputs 122A and 122B. Of course, in some applications, it may be desirable to size some or all of the gain path primary transistors (e.g., 224A, 224A') differently than some or all of the shunt path primary transistors (e.g., 224B, and 224B'). This situation might arise, for example, when a need for a large amplifier gain range necessitates fabricating large shunt path primary transistors (e.g., 224B and 224B') to achieve the desired size ratio with the primary path secondary transistors (e.g., 226A and 226A').

The present invention allows significant variation in implementation, application, and control. For example, the amplifier circuit may be implemented in a variety of process technologies, including Silicon Germanium, Gallium Arsenide, Indium Phosphide, and more conventional Silicon processes. Further variation may be practiced with regards to the transistor amplifier topology to which the current steering circuit 120 of the present invention is applied. Those skilled in the art will readily appreciate that the present invention may be advantageously used with a range of transistor amplifier topologies or configurations. Further variations are possible with regard to the configuration of bias circuit arrangements. All such variations are considered within the scope of the present invention.

Further, the present invention is not limited to usage of specific types of transistor devices for either signal amplification, or for current steering gain control. By way of example, the present invention may be adapted for use to include MOSFETS, JFETS, MESFETS, BJTs, and other types of transistor devices. Indeed, the current steering arrangement may employ any device having suitable impedance characteristics for the range of frequencies at which a given amplifier circuit 100 is expected to operate. Current steering through the gain paths 132 and the shunt paths 134 requires only that some type of series device positioned within these respective paths control current flow responsive to an external control signal. Suitable current steering gain control signals include voltage mode signals as well as current mode signals.

The particular process technology, the topology for amplifier circuit 100, and the type(s) of transistors used in the amplifier circuit 100, will depend upon the application. For example, the amplifier circuit 100 may be used in the intermediate frequency (IF) sections of an RF transmitter signal chain, or may be used in the high-frequency RF sections. Gain control as afforded by the present invention is particularly advantageous for implementing RF output power control, such as that required by several radiotelephone communication standards, such as the well-known IS-95 and GSM standards. Those skilled in the art will readily appreciate the many variations on the amplifier circuit 100 that may be practiced in accordance with the current steering techniques of the present invention.

The foregoing illustrations depicted exemplary single-ended and differential amplifier embodiments for the amplifier circuit 100. These illustrations included various embodiments for the current steering circuit 120 that enables the advantageous current steering techniques of the present invention. However, the foregoing illustrations and accompanying discussions should not be construed as limiting. Indeed, the present invention is limited only by the scope of the claims included herein, and the reasonable equivalents thereof.

What is claimed is:

1. A circuit comprising:
    a first transistor circuit responsive to a first control signal and adapted to conduct a controllable portion of an amplifier output current through a gain path;
    a second transistor circuit responsive to a second control signal and adapted to conduct a controllable portion of the amplifier output current through the gain path;
    a third transistor circuit responsive to the second control signal and adapted to conduct a controllable portion of the amplifier output current through a shunt path;
    wherein the gain path includes an impedance element for developing an output signal proportional to the portion of the amplifier output current conducted through the gain path, and further wherein said second transistor circuit is operative to conduct a desired minimum portion of the amplifier output current through the gain path when the first and second control signals are adjusted for a minimum gain of an amplifier providing the amplifier output current, and
    wherein said first, second, and third transistor circuits are operative such that said first transistor circuit turns on and said second and third transistor circuits turn off at a first setting for the first a second control signals to define a maximum gain for the output signal, and that said first transistor circuit turns off and said second and third transistor circuits turn on at a second setting for the first and second control signals to define a minimum gain for the output signal.

2. The circuit of claim 1 further comprising an amplifier, said amplifier comprising:
    a signal input coupled to a radio frequency signal to be amplified; and
    a signal output coupled to said first, second, and third transistor circuits and adapted to carry the amplifier output current, wherein the amplifier output current is responsive to the radio frequency signal to be amplified.

3. The circuit of claim 1 wherein said amplifier is a transistor amplifier.

4. The circuit of claim 2 further comprising a bias circuit adapted to provide a bias signal to said amplifier such that said amplifier operates in a linear mode over a range of signal amplitudes of the radio frequency signal to be amplified.

5. The circuit of claim 2 further comprising the gain path and the shunt path, and wherein first ends of said gain and shunt paths are coupled to a supply voltage signal, a second end of said gain path is coupled to said first and second transistor circuits, and a second end of said shunt path is coupled to said third transistor circuit.

6. The circuit of claim 5 wherein said amplifier derives the amplifier output current from the supply voltage signal, and further wherein said first, second, and third transistor circuits are operative to divide the amplifier current between said gain and shunt paths.

7. The circuit of claim 1 wherein said first, second, and third transistor circuits are operative such that said first, second, and third transistor circuits partially turn on over a range of settings between a defined minimum gain setting and a defined maximum gain setting for the first and second control signals.

8. The circuit of claim 7 wherein said first, second, and third transistor circuits are operative to effect a linear gain control of the output signal over the range of settings between the defined minimum gain setting and the defined maximum gain setting for the first and second control signals.

9. The circuit of claim 1 wherein said first transistor circuit comprises a first transistor for coupling the gain path to an amplifier output with a conductance responsive to the first control signal, said second transistor circuit comprises a second transistor for coupling the gain path to the amplifier output with a conductance responsive to the second control signal, and said third transistor circuit comprises a third transistor for coupling the shunt path to the amplifier output with a conductance responsive to the second control signal.

10. The circuit of claim 9 wherein said second transistor is smaller than said third transistor by a desired size ratio such that a desired portion of the amplifier output current flows through the gain path and a remaining portion of the amplifier current flows through the shunt path when said first transistor is turned fully off and said second and third transistors are turned fully on via the first and second control signals, respectively.

11. The circuit of claim 10 wherein the desired size ratio of said second transistor size to said third transistor size is about 1:32.

12. The circuit of claim 9 wherein said first transistor is approximately the same size as said third transistor such that said first transistor and said third transistor respond similarly to the first and second control signals, respectively.

13. The circuit of claim 1 further comprising an interface circuit adapted to receive one or more input control signals and generate the first and second control signals responsive to the one or more input control signals.

14. The circuit of claim 13 wherein said interface circuit comprises one or more buffer circuits adapted to buffer the one or more input signals.

15. The circuit of claim 13 wherein said interface circuit comprises a level shifting circuit such that the first and second control signals are generated with signal levels different from a signal level of the one or more input control signals.

16. A circuit comprising:
a first transistor circuit responsive to a first control signal and adapted to conduct a controllable portion of an amplifier output current through a gain path;
a second transistor circuit responsive to a second control signal and adapted to conduct a controllable portion of the amplifier output current through the gain path;
a third transistor circuit responsive to the second control signal and adapted to conduct a controllable portion of the amplifier output current through a shunt path; wherein the gain path includes an impedance element for developing an output signal proportional to the portion of the amplifier output current conducted through the gain path, and further wherein said second transistor circuit is operative to conduct a desired minimum portion of the amplifier output current through the gain path when the first and second control signals are adjusted for a minimum gain of an amplifier providing the amplifier output current; and
an interface circuit adapted to receive one or more input control signals and generate the first and second control signals responsive to the one or more input control signals, wherein said interface circuit comprises a level shifting circuit such that the first and second control signals are generated with signal levels different from a signal level of the one or more input control signals wherein said level shifting circuit changes a level of the one or more input control signals to a different level for the first and second control signals based on a level of an external voltage signal.

17. A circuit comprising:
a first transistor circuit responsive to a first control signal and adapted to couple a corresponding gain path to a corresponding amplifier output, wherein the gain path includes an impedance element for generating an output signal proportional to an amount of current in the gain path;
a second transistor circuit responsive to a second control signal and adapted to couple the corresponding gain path to the corresponding amplifier output; and
a third transistor circuit responsive to the second control signal and adapted to couple a corresponding shunt path to the corresponding amplifier output;
wherein said first, second, and third transistor circuits comprise a current steering arrangement and said current steering arrangement controls a gain of the output signal based on dividing an amplifier output current flowing in the amplifier output between the corresponding gain and shunt paths responsive to the first and second control signals, and
wherein said first, second, and third transistor circuits are operative such that said first transistor circuit turns on and said second and third transistor circuits turn off at a first setting for the first and second control signals to define a maximum gain for the output signal, and such that said first transistor circuit turns off and said second and third transistor circuits turn on at a second setting for the first and second control signals to define a minimum gain for the output signal.

18. A circuit comprising:
a first transistor circuit responsive to a first control signal and adapted to couple a corresponding gain path to a corresponding amplifier output, wherein the gain path includes an impedance element for generating an output signal proportional to an amount of current in the gain path;
a second transistor circuit responsive to a second control signal and adapted to couple the corresponding gain path to the corresponding amplifier output; and
a third transistor circuit responsive to the second control signal and adapted to couple a corresponding shunt path to the corresponding amplifier output; wherein said first, second, and third transistor circuits comprise a current steering arrangement and said current steering arrangement controls a gain of the output signal based on dividing an amplifier output current flowing in the amplifier output between the corresponding gain and shunt paths responsive to the first and second control signals; and
an additional number of said current steering arrangements similarly adapted to couple a like number of additional amplifier outputs to a like number of corresponding gain and shunt path pairs.

19. The circuit of claim 18 wherein said first transistor circuit in each of said additional number of said current steering arrangements is responsive to the first control signal, and said second and third transistor circuits in each of said additional number of said current steering arrangements are responsive to the second control signal.

20. The circuit of claim 19 further comprising an amplifier, wherein said amplifier provides said amplifier outputs, and wherein each said amplifier output carries a corresponding one of the amplifier output currents, each said amplifier output current responsive to a corresponding amplifier input signal.

21. The circuit of claim 20 wherein said amplifier comprises a number of transistor amplifiers.

22. The circuit of claim 21 wherein said number of transistor amplifiers comprise a differential transistor amplifier.

23. The circuit of claim 21 further comprising a bias circuit adapted to provide bias signals to said transistor amplifiers such that each said transistor amplifier operates in a linear mode over a range of signal amplitudes of the corresponding amplifier input signals.

24. The circuit of claim 17 wherein said first, second, and third transistor circuits are operative such that said first, second, and third transistor circuits partially turn on over a range of settings between a defined minimum gain setting and a defined maximum gain setting for the first and second control signals.

25. The circuit of claim 24 wherein said first, second, and third transistor circuits are operative to effect a linear gain control of the output signal over the range of settings between the defined minimum gain setting and the defined maximum gain setting for the first and second control signals.

26. The circuit of claim 17 wherein said first transistor circuit comprises a first transistor for coupling the corresponding gain path to the corresponding amplifier output with a conductance responsive to the first control signal, said second transistor circuit comprises a second transistor for coupling the corresponding gain path to the corresponding amplifier output with a conductance responsive to the second control signal, and said third transistor circuit comprises a third transistor for coupling the corresponding shunt path to the corresponding amplifier output with a conductance responsive to the second control signal.

27. The circuit of claim 26 wherein said second transistor is smaller than said third transistor by a desired size ratio such that a desired portion of the amplifier output current flows through the corresponding gain path and a remaining portion of the amplifier current flows through the corresponding shunt path when said first transistor is turned fully off and said second and third transistors are turned fully on via the first and second control signals, respectively.

28. The circuit of claim 26 wherein said first transistor is approximately the same size as said third transistor such that said first transistor and said third transistor respond similarly to the first and second control signals, respectively.

29. The circuit of claim 26 wherein said first transistor is a different size than said third transistor.

30. The circuit of claim 17 wherein said current steering arrangement additionally comprises a fourth transistor circuit, said fourth transistor circuit responsive to the first control signal and adapted to couple the corresponding amplifier output to the corresponding shunt path.

31. The circuit of claim 30 wherein said second transistor is a desired ratio smaller than said third transistor such that a desired portion of the amplifier output current flows through the corresponding gain path and a remaining portion of the amplifier current flows through the corresponding shunt path when said first and fourth transistors are turned off and said second and third transistors are turned on via the first and second control signals, respectively.

32. The circuit of claim 30 wherein said first transistor and said third transistor are approximately the same size such that said first transistor and said third transistor respond similarly to the first and second control signals, respectively.

33. The circuit of claim 30 wherein said second transistor and said fourth transistor are approximately the same size such that said second and fourth transistors respond similarly to the second and first control signals, respectively.

34. A circuit comprising:
a first transistor circuit responsive to a fist control signal and adapted to couple a corresponding gain path to a corresponding amplifier output, wherein the gain path includes an impedance element for generating an output signal proportional to an amount of current in the gain path;
a second transistor circuit responsive to a second control signal and adapted to couple the corresponding gain path to the corresponding amplifier output; and
a third transistor circuit responsive to the second control signal and adapted to couple a corresponding shunt path to the corresponding amplifier output;
wherein said first, second, and third transistor circuits comprise a current steering arrangement and said current steering arrangement controls a gain of the output signal based on dividing an amplifier output current flowing in the amplifier output between the corresponding gain and shunt paths responsive to the first and second control signals and is operative to effect gain control of the output signal responsive to inverse control of the first and second control signals; and
wherein said current steering arrangement is responsive to said first control signal such that an amount of the amplifier output current flowing in the corresponding gain path increases as a level of the first control signal is increased while a level of the second control signal is not increased.

35. A circuit comprising:
a first transistor circuit responsive to a first control signal and adapted to couple a corresponding gain path to a corresponding amplifier output, wherein the gain path includes an impedance element for generating an output signal proportional to an amount of current in the gain path;
a second transistor circuit responsive to a second control signal and adapted to couple the corresponding gain path to the corresponding amplifier output; and
a third transistor circuit responsive to the second control signal and adapted to couple a corresponding shunt path to the corresponding amplifier output;
wherein said first, second, and third transistor circuits comprise a current steering arrangement and said current steering arrangement controls a gain of the output signal based on dividing an amplifier output current flowing in the amplifier output between the corresponding gain and shunt paths responsive to the first and second control signals and is operative to effect gain control of the output signal responsive to inverse control of the first and second control signals; and
wherein said current steering arrangement is responsive to said second control signal such that an amount of the amplifier output current flowing in the corresponding shunt path increases as a level of the second control signal is increased while a level of the first control signal is not increased.

36. The circuit of claim 17 wherein the impedance element is a resistor.

37. The circuit of claim 17 wherein the corresponding shunt path is designed to have a minimal impedance.

38. The circuit of claim 17 wherein said circuit comprises a portion of an integrated circuit device.

39. A circuit comprising:
an amplifying means for generating an output current responsive to an input radio frequency signal to be amplified;
a first controlled conducting means responsive to a first control signal for conducting a portion of the output current through a gain path, wherein the gain path includes an impedance element for generating an output signal proportional to an amount of current in the gain path;
a second controlled conducting means responsive to a second control signal for conducting a portion of the output current through the gain path; and
a third controlled conducting means responsive to the second control signal for conducting a portion of the output current through a shunt path that does not provide an output signal;
wherein said first, second, and third controlled conducting means are operative to establish a minimum gain path current at a defined setting for the first and second control signals, thereby establishing a minimum gain for the output signal;

wherein said first, second, and third controlled conducting means comprise a current steering arrangement and said current steering arrangement controls a gain of an output signal based on dividing an amplifier output current flowing in the amplifier output between the corresponding gain and shunt paths responsive to the first and second control signals and is operative to effect gain control of the output signal responsive to inverse control of the first and second control signals; and wherein said current steering arrangement is responsive to said first control signal such that an amount of the amplifier output current flowing in the corresponding gain path increases as a level of the first control signal is increased while a level of the second control signal is not increased and is responsive to said second control signal such that an amount of the amplifier output current flowing in the corresponding shunt path increases as the level of the second control signal is increased while the level of the first control signal is not increased.

* * * * *